United States Patent
Fujii (10) Patent No.: US 8,416,024 B2
(45) Date of Patent: Apr. 9, 2013

(54) IMPEDANCE MATCHING ARRANGEMENT FOR AMPLIFIER HAVING SPLIT SHUNT CAPACITOR AND AMPLIFIER INCLUDING THE SAME

(75) Inventor: Kohei Fujii, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/089,385

(22) Filed: Apr. 19, 2011

(65) Prior Publication Data
US 2012/0268210 A1    Oct. 25, 2012

(51) Int. Cl.
*H03F 3/191* (2006.01)
(52) U.S. Cl. .................... 330/302; 330/295
(58) Field of Classification Search ........... 330/124 R, 330/295, 302, 305, 307
See application file for complete search history.

(56) References Cited

U.S. PATENT DOCUMENTS

| | | |
|---|---|---|
| 5,066,925 A | 11/1991 | Freitag |
| 5,089,791 A | 2/1992 | Vasile |
| 5,519,358 A | 5/1996 | Tserng |
| 5,528,203 A * | 6/1996 | Mohwinkel et al. .......... 330/295 |
| 5,952,886 A | 9/1999 | Buer et al. |
| 5,966,520 A | 10/1999 | Buer et al. |
| 6,768,381 B2 * | 7/2004 | Kuriyama ..................... 330/302 |
| 6,847,258 B2 * | 1/2005 | Ishida et al. .................. 330/302 |

* cited by examiner

*Primary Examiner* — Khanh V Nguyen (57) ABSTRACT

An amplifier having an operating frequency includes: an input port and an output port; three gain elements, each having an input terminal and an output terminal; an input matching network; and an output matching network. The input matching network includes: a first microstrip line which is connected to the input port and is an inductor at the operating frequency; a second microstrip line extending between the input terminals of the three gain elements; and a first split shunt capacitor connecting the first microstrip line to the second microstrip line. The output matching network includes: a third microstrip line which is connected to the output port and is an inductor at the operating frequency; a fourth microstrip line extending between the output terminals of the three gain elements; and a second split shunt capacitor connecting the third microstrip line to the fourth microstrip line.

20 Claims, 4 Drawing Sheets

IMPEDANCE MATCHING ARRANGEMENT FOR AMPLIFIER HAVING SPLIT SHUNT CAPACITOR AND AMPLIFIER INCLUDING THE SAME

BACKGROUND

As radio frequency (RF), microwave, and millimeter-wave communication systems and devices continue to proliferate, there is an increasing need for more compact and efficient amplifiers in these frequency bands that can produce a desired output signal level.

Figure 1:
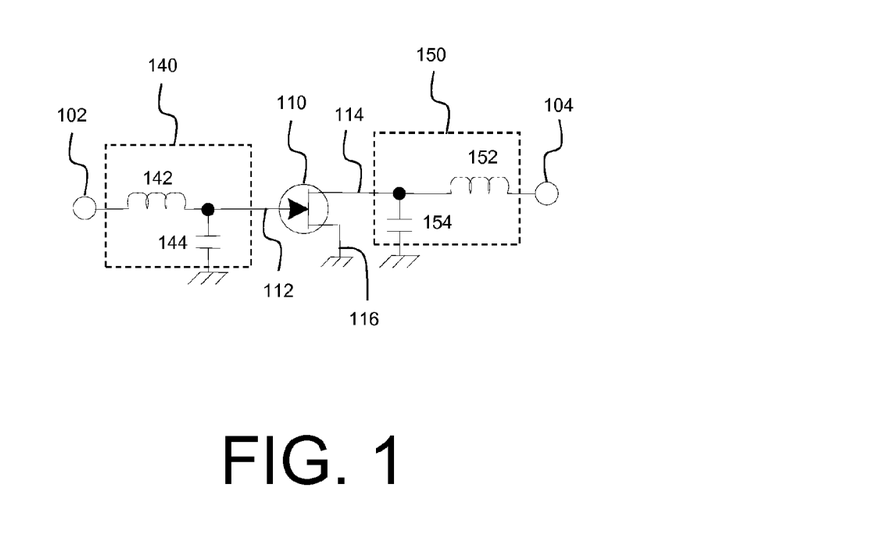
FIG. 1 shows a schematic diagram of an amplifier including input and output matching networks.

FIG. 1 shows an amplifier 100 having an input port 102 configured to receive an input signal (e.g., an RF, microwave, or millimeter wave signal) and an output port 104 configured to output an amplified output signal. The input signal and the amplified output signal may be signals at an operating frequency of amplifier 100 at which amplifier 100 provides an amplification or gain. Amplifier 100 includes gain element 110, input matching network 140, and output matching network 150. Various conventional elements providing DC bias voltages and DC bias currents to gain element 110 and not forming a part of the RF/microwave/millimeter-wave signal path are omitted from FIG. 1 for simplification of the drawing and the description to follow.

Gain element 110 includes an input terminal (e.g., a gate) 112, and output terminal 114 (e.g., a drain or source), and a third terminal 116 (e.g., a source or drain) which is connected to a power supply voltage (e.g., ground). In a beneficial arrangement gain device 110 comprises a field effect transistor (FET). However, other gain elements such as bipolar transistors could be employed instead.

Input matching network 140 is an impedance matching arrangement that attempts to match the output impedance (e.g., 50 ohms; 75 ohms) of an element supplying the input signal to amplifier 100 via input port 102, to the input impedance at the input terminal (e.g., gates) 112 of gain device 110 at an operating frequency or frequencies of amplifier 100. Similarly, output matching network 150 is an impedance matching arrangement that attempts to match the output impedances at the output terminal (e.g., drain) 114 of gain device 110 to an input impedance (e.g., 50 ohms; 75 ohms) of an element (e.g., an antenna) receiving the amplified output signal from amplifier 100 via output port 104.

Input matching network 140 comprises: inductor 142 connected between an input terminal 102 of amplifier 100 and an input terminal 112 of gain device 110, and a capacitor 144 connected between input terminal 112 of gain device 110 and ground. Output matching network 150 comprises: inductor 152 connected between an output terminal 114 of gain device 110 and an output terminal 104 of amplifier 100, and a capacitor 154 connected between output terminal 114 of gain device 110 and ground.

Usually, input and output impedance matching networks 140 and 150 are designed based on filter synthesis theory. Amplifier 100 illustrates a low-pass-filter based design for input and output ports.

To achieve a larger output power, a power amplifier may employ a larger gain device, for example a larger FET that has a larger gate periphery. Depending upon the configuration, at very high operating frequencies (e.g., at millimeter wave frequencies) an input coupling structure (which may also be referred to as input connecting structure) for the input (e.g., gate) of this lamer gain device, and/or an output coupling structure (which may also be referred to as an output connecting structure) for the output (e.g., drain) of this larger gain device may cause the gain device to effectively constitute a plurality of smaller individual gain elements that are effectively, or almost, connected in parallel with each other. These individual gain elements are only effectively, or almost, in parallel with each other and arc not truly in parallel with each other because of the inductances and/or capacitances of the input and output coupling structures mentioned above, which in effect form part of the input and output matching networks for the amplifier. Thus, from a macroscopic viewpoint, the amplifier may be considered to include a single, larger, gain device, while from a microscopic viewpoint, the amplifier may be considered to include a plurality of individual gain elements, which, for example, may share portions of their source and/or drain regions and/or ground contacts, but whose input and/or output terminals are actually and electrically separated by inductances and/or capacitances of the input and/or output coupling structures.

However, when the configurations of the input connecting structure and/or output connecting structure are asymmetrical with respect to the individual gain elements (e.g., FETs), this can create phase imbalances between the inputs and/or outputs of the individual gain elements (e.g., FETs). These phase imbalances for feeding the input signal to the individual gain elements (e.g., FETs) and for extracting the output signal from the individual gain elements (e.g., FETs) can create serious power degradation for the amplifier at very high frequencies such that the amplifier produces a reduced output power.

What is needed, therefore, are input and output matching networks for an amplifier, including coupling structures, which can reduce or eliminate phase imbalances between individual gain elements of the amplifier. What is also needed is an amplifier including such input and output matching networks.

SUMMARY

In one aspect of the inventive concept, an amplifier comprises: an input port and an output port; first, second, and third gain elements, each having an input terminal and an output terminal; an input matching network connected between the input port and the input terminals of the first, second, and third gain elements; and an output matching network connected between the input port and the output terminals of the first, second, and third gain elements. The input matching network comprises: a first input capacitor having a first electrode and having a second electrode connected to a power supply voltage, a second input capacitor having a first electrode and having a second electrode connected to the power supply voltage, a first input inductor connected between the input node and the first electrodes of the first and second input capacitors; a second input inductor connected between the first electrode of the first input capacitor and the input terminal of the first gain element, a third input inductor connected between the first electrode of the first input capacitor and the input terminal of the second gain element, a fourth input inductor connected between the first electrode of the second input capacitor and the input terminal of the second gain element, and a fifth input inductor connected between the first electrode of the second input capacitor and the input terminal of the third gain element. The output matching network comprises: a first output capacitor having a first electrode and having a second electrode connected to the power supply voltage, a second output capacitor having a first electrode and having a second electrode connected to the power supply voltage, a first output inductor connected between the output node and the first electrodes of the first and second output capacitors; a second output inductor connected between the first electrode of the first output capacitor and the output terminal of the first gain element, a third output inductor connected between the first electrode of the first output capacitor and the input terminal of the second gain element, a fourth output inductor connected between the first electrode of the second output capacitor and the output terminal of the second gain element, and a fifth output inductor connected between the first electrode of the second output capacitor and the input terminal of the third gain element.

In one or more embodiments, the amplifier further comprises: a first tapered connector that connects the first input inductor and the first electrodes of the first and second input capacitors; and a second tapered connector that connects the first output inductor and the first electrodes of the first and second output capacitors.

In one or more embodiments, the second electrodes of the first and second input capacitors comprises a common electrode having a through-hole disposed therein connecting the common electrode to the power supply voltage.

In one or more embodiments, the power supply voltage is ground.

In one or more embodiments, the first electrodes of the first and second input capacitors are disposed on opposite sides of the common electrode.

In one or more embodiments, the first electrodes of the first and second input capacitors and the common electrode are all disposed in a same surface of a semiconductor substrate In one or more embodiments, the first input inductor comprises a microstrip line.

In one or more embodiments, the second, third, fourth and fifth input inductors all comprise a common microstrip line extending from the input terminal of the first gain element, past the input terminal of the second gain element, to the input terminal of the third gain element.

In one or more embodiments, the first, second, and third gain elements are all field effect transistors each having a third terminal connected to ground.

In one or more embodiments, the second electrodes of the first and second output capacitors comprises a common electrode having a through-hole disposed therein connecting the common electrode to the power supply voltage.

In one or more embodiments, the first electrodes of the first and second output capacitors are disposed on opposite sides of the common electrode.

In one or more embodiments, the first electrodes of the first and second output capacitors and the common electrode are all disposed in a same surface of a semiconductor substrate.

In one or more embodiments, the first output inductor comprises a microstrip line.

In one or more embodiments, the second, third, fourth and fifth output inductors all comprise a common microstrip line extending from the output terminal of the first gain element, past the output terminal of the second gain element, to the output terminal of the third gain element In another aspect of the inventive concept, an amplifier is configured to operate at an operating frequency. The amplifier comprises: an input port and an output port; first, second, and third gain elements, each having an input terminal and an output terminal; an input matching network; and an output matching network. The input matching network comprises: a first microstrip line connected to the input port and being configured to be an input inductor at the operating frequency of the amplifier, a second microstrip line extending between the input terminals of the first, second and third gain elements, and a first split shunt capacitor connecting the first microstrip line to the second microstrip line. The output matching network comprises a third microstrip line connected to the output port and being configured to be an output inductor at the operating frequency of the amplifier, a fourth microstrip line extending between the output terminals of the first, second and third gain elements, and second split shunt capacitor connecting the third microstrip line to the fourth microstrip line.

In one or more embodiments, the amplifier further comprises: a first tapered connector that connects the first microstrip line to the first split shunt capacitor; and a second tapered connector that connects the second split shunt capacitor and the third microstrip line.

In one or more embodiments, the first and second split shunt capacitors each comprise a common electrode having a through-hole disposed therein connecting the common electrode to a power supply voltage, and a pair of electrodes disposed respectively at opposite sides of the common electrode.

In one or more embodiments, the second microstrip line is configured to comprise, at the operating frequency: a second input inductor connected between a first one of the pair of electrodes of the first split shunt capacitor and the input terminal of the first gain element, a third input inductor connected between the first one of the pair of electrodes of the first split shunt capacitor and the input terminal of the second gain element, a fourth input inductor connected between the input terminal of the second gain element and a second one of the pair of electrodes of the first split shunt capacitor, and a fifth input inductor connected between the first electrode of the second one of the pair of electrodes of the first split shunt capacitor and the input terminal of the third gain element.

In one or more embodiments, the second, third, fourth, and fifth input inductors all have substantially a same inductance value.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to he coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As used herein, "approximately" means within 10%. When two values are said to be "substantially the same" it means that the values are the same within the reasonable manufacturing tolerances. By contrast, "substantially different" means substantially not the same, and therefore "more different" than reasonable manufacturing tolerances.

Example amplifiers will be described below where the gain elements are field effect transistors (FETs). However, it should be understood that the principles described below can be extended to other types of gain elements, such as hetero junction bipolar transistors (HBTs), GaN FETs, GaAs PHEMTs, etc.

Also, in FIGS. 2-5 and the accompanying descriptions below, conventional elements providing DC bias voltages and DC bias currents to gain elements and not forming a part of the RF/microwave/millimeter-wave signal path are omitted for simplification of the drawings and the accompanying descriptions.

In the descriptions below, amplifiers are described which include a gain device having an input and/or output coupling structure such that from a macroscopic viewpoint, the amplifier may be considered to include a single, larger, gain device, while from a microscopic viewpoint, the amplifier may be considered to include a plurality of individual gain elements, which, for example, may share portions of their source and/or drain regions and/or ground contacts, but whose input and/or output terminals are actually and electrically separated by inductances and/or capacitances of the input and/or output coupling structures. The use of the term "gain element" in the description and claims to follow will be understood to be in reference to this context.

As discussed above in the Background, when the configurations of input and output connecting structures for amplifiers having a plurality of gain elements which are effectively connected in parallel are asymmetrical with respect to the individual gain elements, this can create phase imbalances between the inputs and/or outputs of the individual gain elements, which in turn can create serious power degradation for the amplifier at very high frequencies such that the amplifier produces a reduced output power. For a better understanding and appreciation of this, examples of such amplifiers will now be described with respect to FIGS. 2 and 3.

Figure 2:
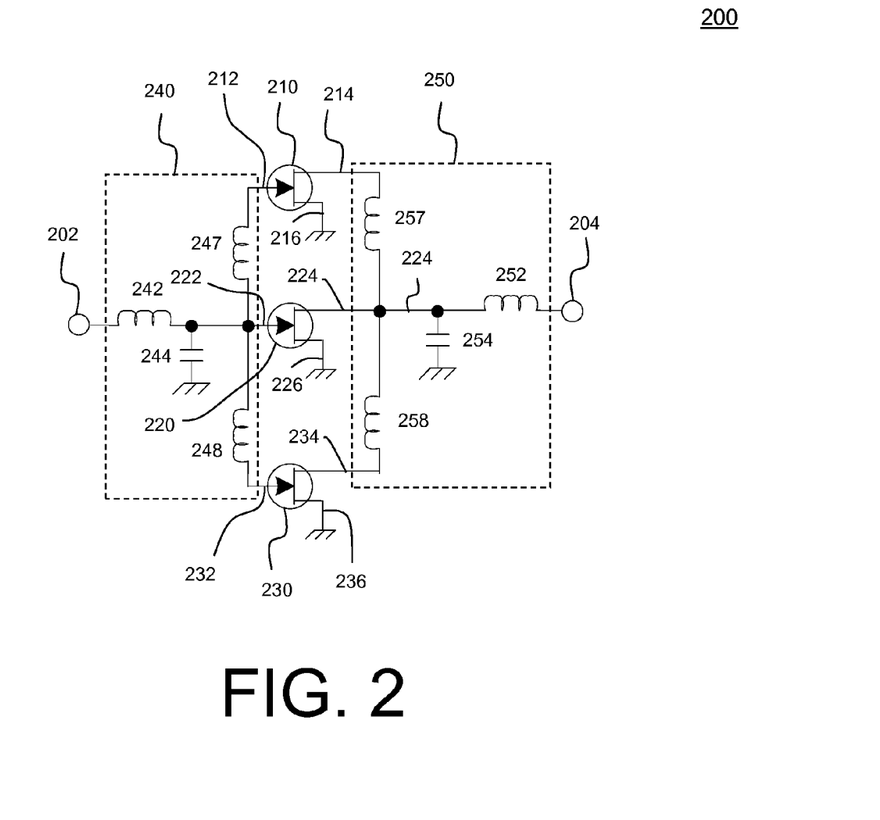
FIG. 2 shows a schematic diagram of another amplifier including input and output matching networks.

FIG. 2 shows a schematic diagram of an amplifier 200 having an input port 202 configured to receive an input signal (e.g., an RF, microwave, or millimeter wave signal) and an output port 204 configured to output an amplified output signal. The input signal and the amplified output signal may be signals at an operating frequency of amplifier 200 at which amplifier 100 provides an amplification or gain. Amplifier 200 includes a plurality of individual gain elements (e.g., FETs) 210, 220, and 230, and input and output matching networks 240 and 250, respectively. In some embodiments, amplifier 200 may comprise a monolithic microwave integrated circuit (MMIC).

First, second, and third gain elements 210, 220 and 230 have, respectively: input terminals 212, 222, and 232; output terminals 214, 224, and 234; and third terminals 216, 226, and 236 each of which is connected to a power supply voltage (e.g., ground).

Input matching network 240 includes a first input inductor 242, an input capacitor 244, and second and third input inductors 247 and 248.

Output matching network 250 includes a first output inductor 252, an output capacitor 254, and second and third output inductors 257 and 258.

Figure 3:
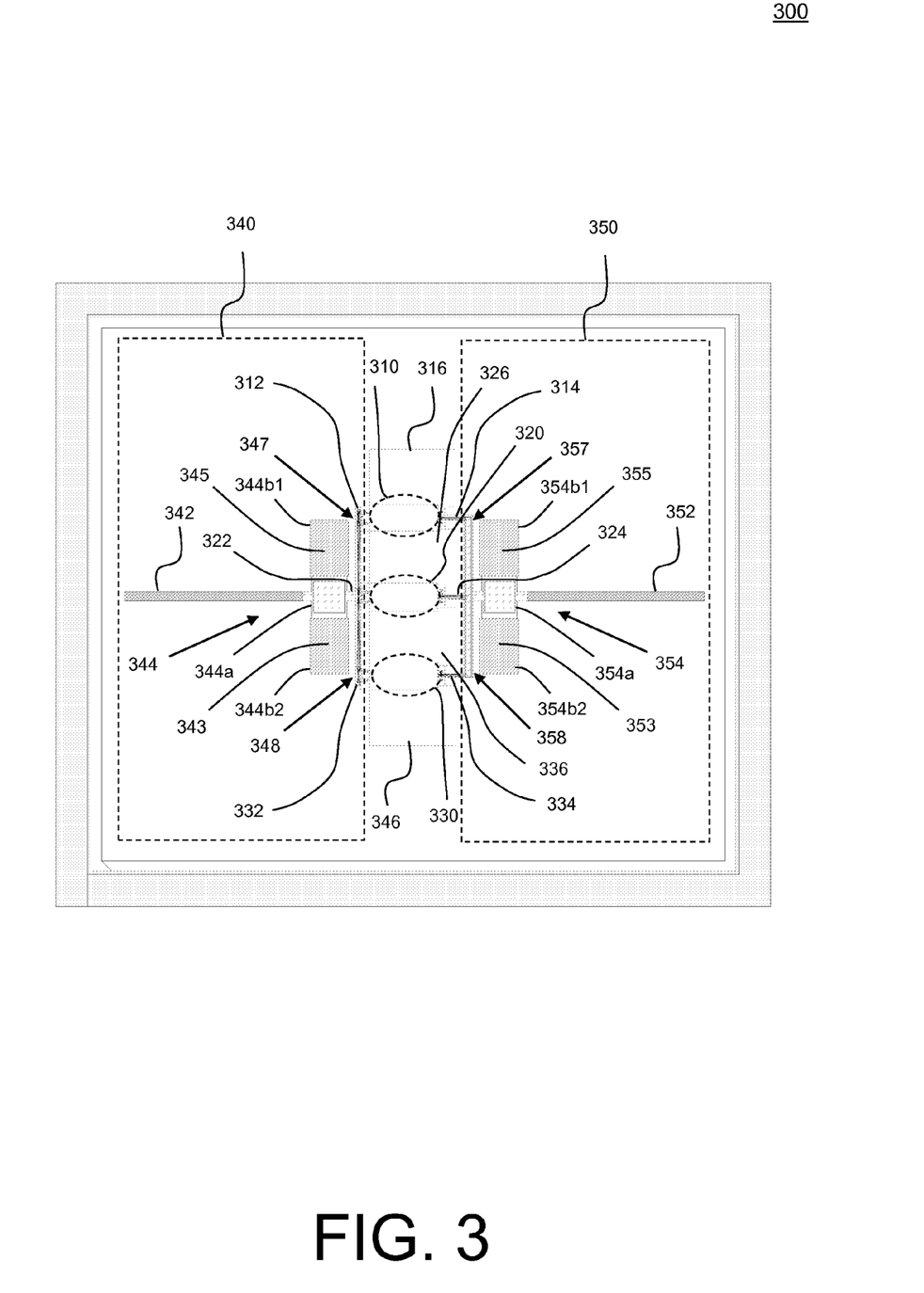
FIG. 3 illustrates a layout for an amplifier including input and output matching networks.

FIG. 3 illustrates a layout for an amplifier 300 which may be an embodiment of amplifier 200 of FIG. 2

Amplifier 300 includes a plurality of individual gain elements (e.g., FETs) 310, 320, and 330, and input and output matching networks 340 and 350, respectively. In some embodiments, amplifier 300 may comprise a monolithic microwave integrated circuit (MMIC).

First, second, and third gain elements 310, 320 and 330 have, respectively: input terminals 312, 322, and 332; output terminals 314, 324, and 334; and third terminals 316, 326, 336 and 346 each of which is connected to a power supply voltage (e.g., ground). It should be noted that because of the architecture of amplifier 300, first, second, and third gain elements 310, 320 and 330 share among them third terminals 316, 326, 336 and 346, each of which as noted is connected to the same power supply voltage (e.g., ground).

Input matching network 340 includes a first input microstrip line 342, an input capacitor 344, and a second input microstrip line 347/348. First input microstrip line 342 is an inductor at the operating frequency of amplifier 300, and second input microstrip line 347/348 comprises a first inductor between input terminal 312 of first gain element 310 and input terminal 322 of second gain element 320, and a second inductor between input terminal 322 of second gain element 320 and input terminal 332 of third gain element 330. Also, input capacitor 344 includes: a common electrode 344a connected between the first input microstrip line 342 and input terminal 322 of second gain element 320, and second electrodes 344b1 and 344b2 each having a through-hole connecting to a power supply voltage (e.g., ground) provided on an opposite side of a substrate on which amplifier 300 is provided.

Output matching network 350 includes a first output microstrip line 352, an output capacitor 354, and a second output microstrip line 357/358. First output microstrip line 352 is an inductor at the operating frequency of amplifier 300, and second output microstrip line 357/358 comprises a first inductor between output terminal 314 of first gain element 310 and output terminal 324 of second gain element 320, and a second inductor between output terminal 324 of second gain element 320 and output terminal 334 of third gain element 330, respectively. Also, output capacitor 354 includes a common electrode 354a connected between the first output microstrip line 352 and output terminal 322 of second gain element 320.

As can be seen in FIGS. 2 and 3, in the amplifier(s) 200 and 300 the input and output matching networks are asymmetrical with respect to the first, second and third gain elements. In particular, while the input and output capacitors are essentially connected directly to the input and output terminals, respectively of the second gain element, these capacitors are connected to the input and output terminals, respectively, of the first and third gain elements via the inductances (247/248 and 257/258, respectively in FIG. 2) of the second and fourth microstrip lines (347/348 and 357/358, respectively in FIG. 3).

This asymmetrical configuration can create phase imbalances between the inputs and/or outputs of the individual gain elements, which in turn can create serious power degradation for the amplifier at very high frequencies such that the amplifier produces a reduced output power.

Figure 4:
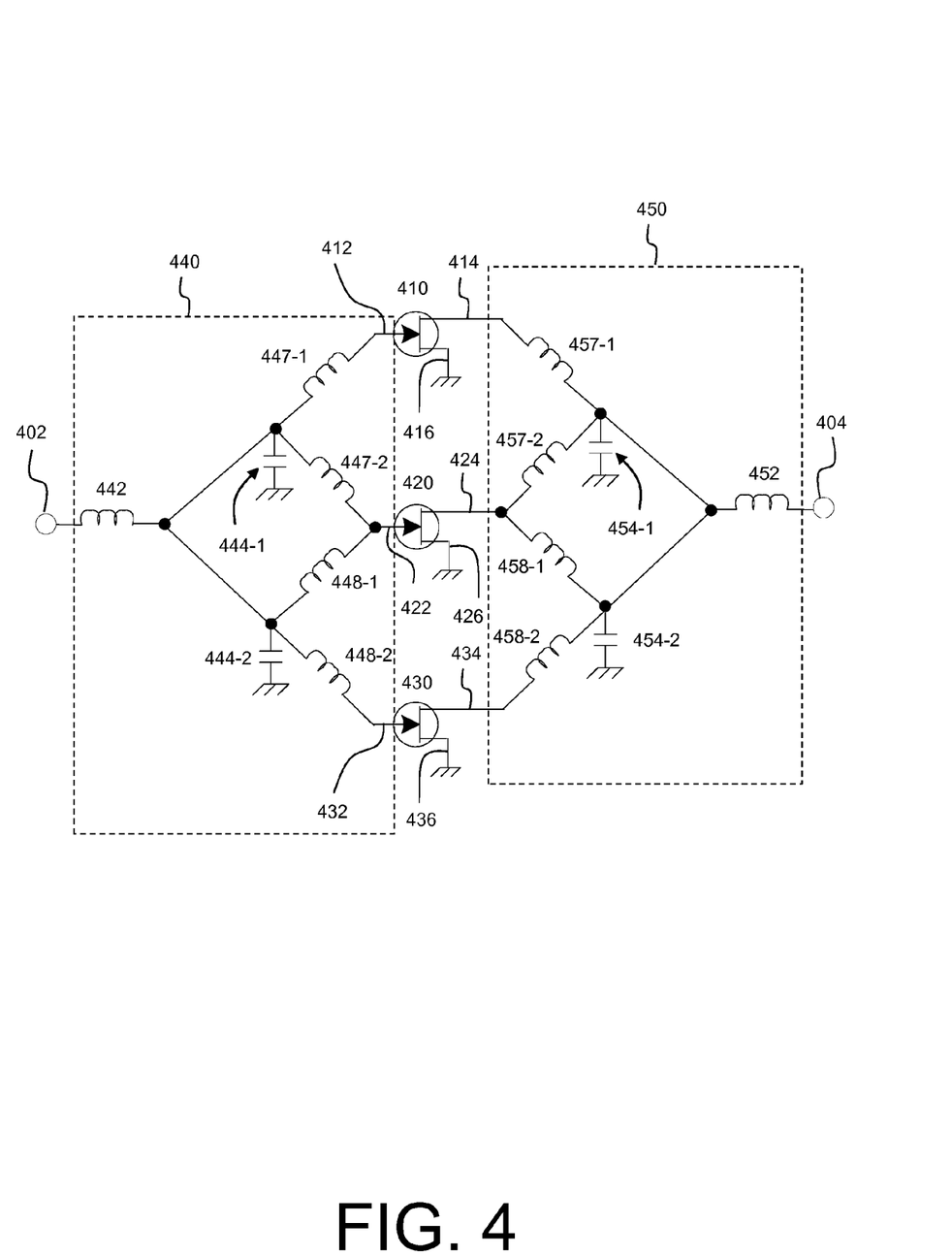
FIG. 4 shows a schematic diagram of an embodiment of an amplifier including input and output matching networks having split shunt capacitors.

FIG. 4 shows a schematic diagram of an embodiment of an amplifier 400 including input and output matching networks having split shunt capacitors.

Amplifier 400 includes an input port 402 configured to receive an input signal (e.g., an RF, microwave, or millimeter wave signal) and an output port 404 configured to output an amplified output signal. The input signal and the amplified output signal may be signals at an operating frequency of amplifier 400 at which amplifier 400 provides an amplification or gain.

Amplifier 400 also includes a plurality of individual gain elements (e.g., FETs) 410, 420, and 430, and input and output matching networks 440 and 450, respectively. In some embodiments, amplifier 400 may comprise a monolithic microwave integrated circuit (MMIC).

First, second, and third gain elements 410, 420 and 430 have, respectively: input terminals 412, 422, and 432; output terminals 414, 424, and 434; and third terminals 416, 426, and 436 each of which is connected to a power supply voltage (e.g., ground).

Input matching network 440 is an impedance matching arrangement that attempts to match the output impedance (e.g., 50 ohms; 75 ohms) of an element supplying the input signal to amplifier 400 via input port 402, to the input impedance at the input terminals (e.g., gates) 412, 422, and 432 of first, second and third gain elements 410, 420 and 430 at an operating frequency or frequencies of amplifier 400. Input matching network 440 includes a first input inductor 442, first and second input capacitors 444-1 and 444-2, and second, third, fourth, an fifth input inductors 447-1, 447-2, 448-1 and 448-2, respectively.

First input capacitor 444-1 has a first electrode, and has a second electrode connected to a power supply voltage (e.g., ground). Second input capacitor 444-2 has a first electrode, and has a second electrode connected to the power supply voltage (e.g., ground). First input inductor 442 is connected between input port 402 and the first electrodes of first and second input capacitors 444-1 and 444-2. Second input inductor 447-1 is connected between the first electrode of first input capacitor 444-1 and input terminal 412 of first gain element 410. Third input inductor 447-2 is connected between the first electrode of first input capacitor 444-1 and input terminal 422 of second gain clement 420. Fourth input inductor 448-1 is connected between the first electrode of second input capacitor 444-2 and input terminal 422 of second gain element 420. Fifth input inductor 448-2 is connected between the first electrode of second input capacitor 444-2 and input terminal 432 of third gain rent 430.

In some embodiments, second and third input inductors 447-1 and 447-2 have inductance values that are within 5% of each other, and therefore are deemed to be "substantially the same" as each other. In some embodiments, fourth and fifth input inductors 448-1 and 448-2 have inductance values that are within 5% of each other, and therefore are deemed to be "substantially the same" as each other. In some embodiments, second, third, fourth, an fifth input inductors 447-1, 447-2, 448-1 and 448-2.

First and second input capacitors 444-1 and 444-2 comprise a split shunt input capacitor, as will be explained in further detail with respect to FIG. 5 below.

Output matching network 450 is an impedance matching arrangement that attempts to match the output impedances at the output terminals (e.g., drains) 414, 424, and 434 of first, second and third gain elements 410, 420 and 430, respectively, at an operating frequency or frequencies of amplifier 400 to an impedance (e.g., 50 ohms; 75 ohms) of an element (e.g., an antenna) receiving the amplified output signal from amplifier 400 via output port 404. Output matching network 450 includes a first output inductor 452, first and second output capacitors 454-1 and 454-2, and second, third, fourth, an fifth output inductors 457-1, 457-2, 458-1 and 458-2, respectively.

First output capacitor 454-1 has a first electrode, and has a second electrode connected to a power supply voltage (e.g., ground). Second output capacitor 454-2 has a first electrode, and has a second electrode connected to the power supply voltage (e.g., ground). First output inductor 452 is connected between output port 404 and the first electrodes of first and second output capacitors 454-1 and 454-2. Second output inductor 457-1 is connected between the first electrode of first output capacitor 454-1 and output terminal 414 of first gain element 410. Third output inductor 457-2 is connected between the first electrode of first output capacitor 454-1 and output terminal 424 of second gain element 420. Fourth output inductor 458-1 is connected between the first electrode of second output capacitor 454-2 and output terminal 424 of second gain element 420. Fifth output inductor 458-2 is connected between the first electrode of second output capacitor 454-2 and output terminal 434 of third gain element 430.

In some embodiments, second and third output inductors 457-1 and 457-2 have inductance values that are within 5% of each other, and therefore are deemed to be "substantially the same" as each other. In some embodiments, fourth and fifth output inductors 458-1 and 458-2 have inductance values that are within 5% of each other, and therefore are deemed to be "substantially the same" as each other. In some embodiments, second, third, fourth, an fifth output inductors 457-1, 457-2, 458-1 and 458-2.

First and second output capacitors 454-1 and 454-2 comprise a split shunt output capacitor, as will be explained in further detail with respect to FIG. 5 below.

Figure 5:
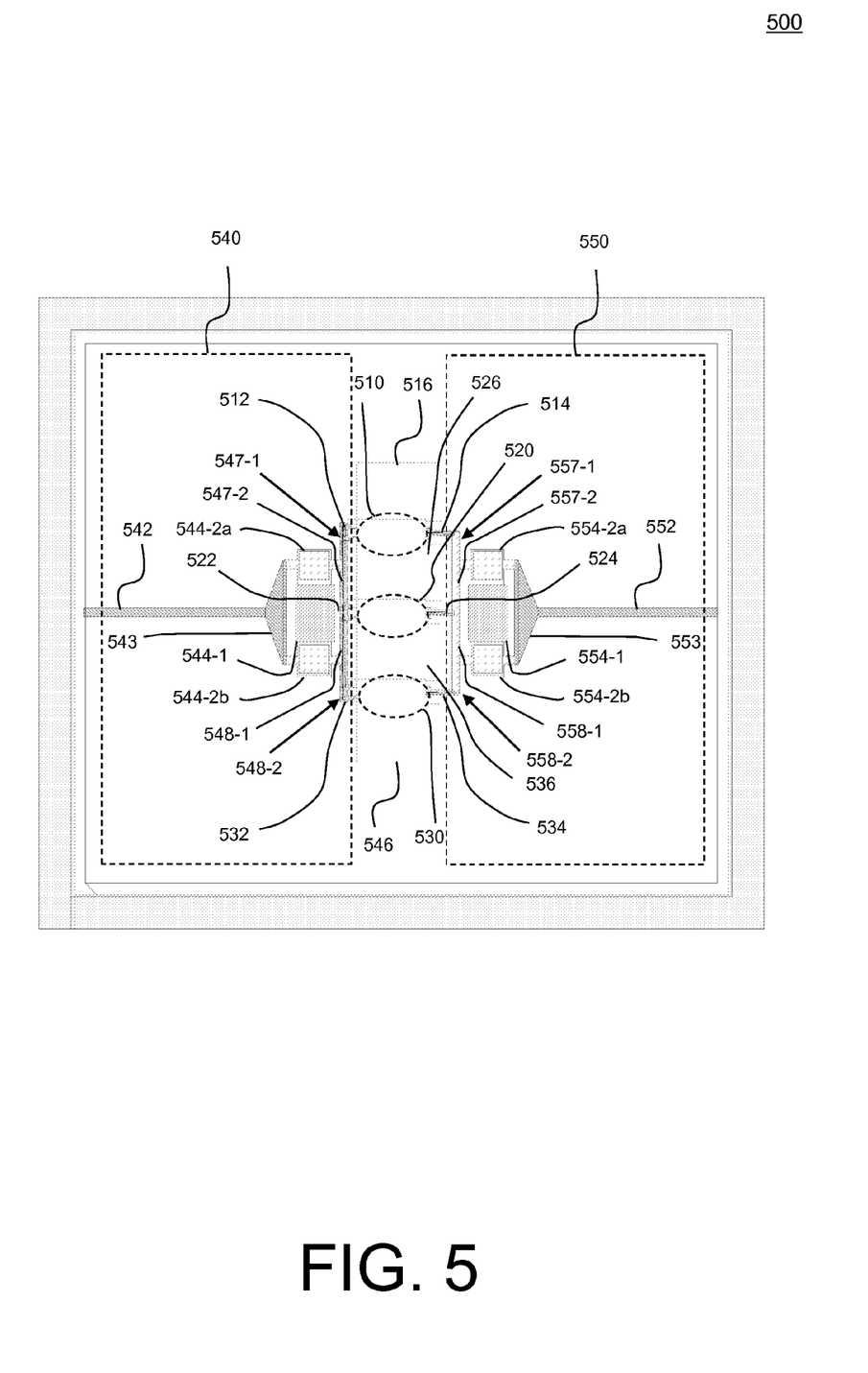
FIG. 5 illustrates one example embodiment of a layout for an amplifier including input and output matching networks having split shunt capacitors.

FIG. 5 illustrates a layout for an amplifier 500 including input and output matching networks having split shunt capacitors. Amplifier 500 may be an embodiment of amplifier 400 of FIG. 4.

Amplifier 500 includes a plurality of individual gain elements (e.g., FETs) 510, 520, and 530, and input and output matching networks 540 and 550, respectively. In some embodiments, amplifier 500 may comprise a monolithic microwave integrated circuit (MMIC).

First, second, and third gain elements 510, 520 and 530 have, respectively: input terminals 512, 522, and 532; output terminals 514, 524, and 534; and third terminals 516, 526, 536, and 546 each of which is connected to a power supply voltage (e.g., ground). It should be noted that because of the architecture of amplifier 500, first, second, and third gain elements 510, 520 and 530 share among them third terminals 516, 526, 536 and 546, each of which as noted is connected to the same power supply voltage (e.g., ground).

Input matching network 540 includes a first microstrip line 542, a first split shunt capacitor, and a second microstrip line 547-1/547-2/548-1/548-2.

The first split shunt capacitor comprises a common electrode 544-1 (which, e.g., functions as the second electrodes for first and second input capacitors 444-1 and 444-2 in FIG. 4), and a pair of electrodes 544-2*a* and 544-2*b* (e.g., the first electrodes for first and second input capacitors 444-1 and 444-2 in FIG. 4). Common electrode 544-i has a through-hole disposed therein connecting common electrode 544-1 to a power supply voltage (e.g., around), and electrodes 544-2*a* and 544-2*b* are disposed respectively at opposite sides of common electrode 544-1.

First microstrip line 542 is an inductor at the operating frequency of amplifier 500, and is connected to the first split shunt capacitor via a first triangular-shaped, or tapered, connector 543. In particular, first microstrip line 542 (e.g., first input inductor 442 in FIG. 4) is connected to electrodes 544-2*a* and 544-2*b* (e.g., first electrodes for first and second input capacitors 444-1 and 444-2 in FIG. 4) via tapered connector 543.

Second microstrip line 547-1/547-2/548-1/548-2 comprises, at the operating frequency of amplifier 500: a second input inductor 547-1 (e.g., second input inductor 447-1 of FIG. 4) connected between electrode 544-2*a* of the first split shunt capacitor and input terminal 512 of first gain element 510; a third input inductor 547-2 (e.g., third input inductor 447-2 of FIG. 4) connected between electrode 544-2*a* of the first split shunt capacitor and input terminal 522 of second gain element 520; a fourth input inductor 548-1 (e.g., fourth input inductor 448-1 of FIG. 4) connected between input terminal 522 of second gain element 520 and electrode 544-2*b* of the first split shunt capacitor; and a fifth input inductor 548-2 (e.g., fifth input inductor 448-2 of FIG. 4) connected between electrode 544-2*b* of the first split shunt capacitor and input terminal 532 of third gain element 530.

Output matching network 550 includes a third microstrip line 552, a second split shunt capacitor, and a fourth microstrip line 557-1/557-2/558-1/558-2.

The second split shunt capacitor comprises a common electrode 554-1 (which, e.g., functions as the second electrodes for first and second output capacitors 454-1 and 454-2 in FIG. 4), and a pair of electrodes 554-2*a* and 554-2*b* (e.g., the first electrodes for first and second output capacitors 454-1 and 454-2 in FIG. 4). Common electrode 554-1 has a through-hole disposed therein connecting common electrode 554-1 to a power supply voltage (e.g., ground), and electrodes 554-2*a* and 554-2*b* are disposed respectively at opposite sides of common electrode 554-1.

Third microstrip line 552 is an inductor at the operating frequency of amplifier 500, and is connected to the first split shunt capacitor via a first triangular-shaped, or tapered, connector 553. In particular, third microstrip line 552 (e.g., first output inductor 452 in FIG. 4) is connected to electrodes 544-2*a* and 544-2*b* (e.g., first electrodes for first and second output capacitors 454-1 and 454-2 in FIG. 4) via tapered connector 553.

Fourth microstrip line 557-1/557-2/558-1/558-2 comprises, at the operating frequency of amplifier 500: a second output inductor 557-1 (e.g., second output inductor 457-1 of FIG. 4) connected between electrode 554-2*a* of the first split shunt capacitor and output terminal 514 of first gain element 510; a third output inductor 557-2 (e.g., third output inductor 457-2 of FIG. 4) connected between electrode 554-2*a* of the first split shunt capacitor and output terminal 524 of second gain element 520; a fourth output inductor 558-1 (e.g., fourth output inductor 458-1 of FIG. 4) connected between output terminal 524 of second gain element 520 and electrode 554-2*b* of the first split shunt capacitor; and a fifth output inductor 558-2 (e.g., fifth output inductor 458-2 of FIG. 4) connected between electrode 554-2*b* of the first split shunt capacitor and output terminal 534 of third gain element 530.

As can be seen from FIGS. 4 and 5, in the amplifier(s) 400 and 500 the input and output matching networks are symmetrical with respect to the first, second and third gain elements. Accordingly, the amplified output signal components from each of the first, second and third gain elements can be added together substantially in phase at the output terminal of the amplifier to produce an increased output power compared to an amplifier with equivalent gain elements that are coupled together asymmetrically and which have phase imbalances between the inputs and/or outputs of the individual gain elements.

While example embodiments are disclosed herein, one of ordinary skill in the art appreciates that many variations that are in accordance with the present teachings are possible and remain within the scope of the appended claims. For example, although the descriptions and figures above illustrate an exemplary case where a matching network multiplexes signals to and from an antenna and a plurality of filters, the matching network is not limited to use with an antenna. In general, any appropriate device, such as a broadband amplifier or filter, can be passively multiplexed with the plurality of filters using the matching network as described above. The embodiments therefore are not to be restricted except within the scope of the appended claims.

The invention claimed is:

1. An amplifier, comprising:
   an input port and an output port;
   first, second, and third gain elements, each having an input terminal and an output terminal;
   an input matching network connected between the input port and the input terminals of the first, second, and third gain elements; and
   an output matching network connected between the input port and the output terminals of the first, second, and third gain elements,
   wherein the input matching network comprises:
      a first input capacitor having a first electrode and having a second electrode connected to a supply voltage,
      a second input capacitor having a first electrode and having a second electrode connected to the supply voltage,
      a first input inductor connected between the input port and the first electrodes of the first and second input capacitors;
      a second input inductor connected between the first electrode of the first input capacitor and the input terminal of the first gain element,
      a third input inductor connected between the first electrode of the first input capacitor and the input terminal of the second gain element,
      a fourth input inductor connected between the first electrode of the second input capacitor and the input terminal of the second gain element, and
      a fifth input inductor connected between the first electrode of the second input capacitor and the input terminal of the third gain element, and
   wherein the output matching network comprises:
      first output capacitor having a first electrode and having a second electrode connected to the supply voltage,
      a second output capacitor having a first electrode and having a second electrode connected to the supply voltage,
      a first output inductor connected between the output port and the first electrodes of the first and second output capacitors;

a second output inductor connected between the first electrode of the first output capacitor and the output terminal of the first gain element, a third output inductor connected between the first electrode of the first output capacitor and the input terminal of the second gain element, a fourth output inductor connected between the first electrode of the second output capacitor and the output terminal of the second gain element, and a fifth output inductor connected between the first electrode of the second output capacitor and the output terminal of the third gain element.

2. The amplifier of claim 1, further comprising:
a first tapered connector that connects the first input inductor and the first electrodes of the first and second input capacitors; and
a second tapered connector that connects the first output inductor and the first electrodes of the first and second output capacitors.

3. The amplifier of claim 1, wherein the second electrodes of the first and second input capacitors comprises a common electrode having a through-hole disposed therein connecting the common electrode to the supply voltage.

4. The amplifier of claim 3, wherein the supply voltage is ground.

5. The amplifier of claim 3, wherein the first electrodes of the first and second input capacitors are disposed on opposite sides of the common electrode.

6. The amplifier of claim 5, wherein the first electrodes of the first and second input capacitors and the common electrode are all disposed in a same surface of a semiconductor substrate 7. The amplifier of claim 1, wherein the first input inductor comprises a microstrip 8. The amplifier of claim 1, wherein the second, third, fourth and fifth input inductors all comprise a common microstrip line extending from the input terminal of the first gain element, past the input terminal of the second gain element, to the input terminal of the third gain element.

9. The amplifier of claim 1, wherein the first, second, and third gain elements are all field effect transistors each having a third terminal connected to ground.

10. The amplifier of claim 1, wherein the second electrodes of the first and second output capacitors comprises a common electrode having a through-hole disposed therein connecting the common electrode to the supply voltage.

11. The amplifier of claim 10, wherein the supply voltage is ground.

12. The amplifier of claim 10, wherein the first electrodes of the first and second output capacitors are disposed on opposite sides of the common electrode.

13. The amplifier of claim 12, wherein the first electrodes of the first and second output capacitors and the common electrode are all disposed in a same surface of a semiconductor substrate.

14. The amplifier of claim 10, wherein the first output inductor comprises a microstrip line.

15. The amplifier of claim 1, wherein the second, third, fourth and fifth output inductors all comprise a common microstrip line extending from the output terminal of the first gain element, past the output terminal of the second gain element, to the output terminal of the third gain element.

16. An amplifier configured to operate at an operating frequency, the amplifier comprising:
an input port and an output port;
first, second, and third gain elements, each having an input terminal and an output terminal;
an input matching network; and
an output matching network,
wherein the input matching network comprises:
a first microstrip line connected to the input port arid being configured to be an input inductor at the operating frequency of the amplifier,
a second microstrip line extending between the input terminals of the first, second and third gain elements, and
a first split shunt capacitor connecting the first microstrip line to the second microstrip line, and
wherein the output matching network comprises:
a third microstrip line connected to the output port and being configured to be an output inductor at the operating frequency of the amplifier,
a fourth microstrip line extending between the output terminals of the first, second and third gain elements, and
a second split shunt capacitor connecting the third microstrip line to the fourth microstrip line.

17. The amplifier of claim 16, further comprising:
a first tapered connector that connects the first microstrip line to the first split shunt capacitor; and
a second tapered connector that connects the second split shunt capacitor and the third microstrip line.

18. The amplifier of claim 16, wherein the first and second split shunt capacitors each comprise a common electrode having a through-hole disposed therein connecting the common electrode to a supply voltage, and a pair of electrodes disposed respectively at opposite sides of the common electrode.

19. The amplifier of claim 18, wherein the second microstrip line is configured to comprise, at the operating frequency:
a second input inductor connected between a first one of the pair of electrodes of the first split shunt capacitor and the input terminal of the first gain element,
a third input inductor connected between the first one of the pair of electrodes of the first split shunt capacitor and the input terminal of the second gain element,
a fourth input inductor connected between the input terminal of the second gain element and a second one of the pair of electrodes of the second split shunt capacitor, and
a fifth input inductor connected between the first electrode of the second one of the pair of electrodes of the second split shunt capacitor and the input terminal of the third gain element.

20. The amplifier of claim 19, wherein the second, third, fourth, and fifth input inductors all have substantially a same inductance value.

* * * * *